US011388848B2

(12) United States Patent
Ishikawa et al.

(10) Patent No.: US 11,388,848 B2
(45) Date of Patent: Jul. 12, 2022

(54) COMPONENT SUPPLY DEVICE

(71) Applicant: FUJI CORPORATION, Chiryu (JP)

(72) Inventors: Kazuma Ishikawa, Chiryu (JP); Toru Matsumoto, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 265 days.

(21) Appl. No.: 16/611,873

(22) PCT Filed: May 18, 2017

(86) PCT No.: PCT/JP2017/018664
§ 371 (c)(1),
(2) Date: Nov. 8, 2019

(87) PCT Pub. No.: WO2018/211657
PCT Pub. Date: Nov. 22, 2018

(65) Prior Publication Data
US 2021/0153396 A1 May 20, 2021

(51) Int. Cl.
*H05K 13/02* (2006.01)
*H05K 13/04* (2006.01)

(52) U.S. Cl.
CPC ......... *H05K 13/021* (2013.01); *H05K 13/022* (2013.01); *H05K 13/0409* (2018.08); *H05K 13/0434* (2013.01)

(58) Field of Classification Search
CPC .... H05K 13/02; H05K 13/021; H05K 13/022; H05K 13/0409; H05K 13/0434
See application file for complete search history.

(56) References Cited

U.S. PATENT DOCUMENTS 5,042,643 A  8/1991  Akama
6,594,887 B1 * 7/2003  Okuda ............... H05K 13/0434
                                                        29/739
(Continued)

FOREIGN PATENT DOCUMENTS

JP   2-305707 A   12/1990
JP   3-177220 A    8/1991
(Continued)

OTHER PUBLICATIONS

International Search Report dated Aug. 1, 2017 in PCT/JP2017/018664 filed on May 18, 2017.

*Primary Examiner* — Minh N Trinh
(74) *Attorney, Agent, or Firm* — Oblon, McClelland, Maier & Neustadt, L.L.P.

(57) ABSTRACT

A component supply device including: a stage configured such that components can be scattered on the stage; a slide device configured to slide the stage; a contacting section configured to contact the component scattered on the stage in accordance with sliding of the stage by the slide device; and a control device configured to control operation of the slide device, wherein the control device includes a determining section configured to determine whether the stage has been slid to a set position when the stage is slid towards the contacting section, and an operation control section configured to control operation of the slide device so as to, in a case in which it is determined by the determining section that the stage has not been slid to the set position, after sliding the stage in a direction away from the contacting section, once again slide the stage towards the contacting section.

4 Claims, 13 Drawing Sheets

(56) References Cited

U.S. PATENT DOCUMENTS

2015/0237772 A1* 8/2015 Nozawa .............. H05K 13/028
                                                29/703
2017/0238448 A1   8/2017 Iwaki
2020/0305316 A1*  9/2020 Matsumoto .......... H05K 13/028
2021/0153396 A1*  5/2021 Ishikawa .............. H05K 13/022

FOREIGN PATENT DOCUMENTS

JP   WO2016-139742 A1   9/2016
WO   WO 2016/071984 A1  5/2016

* cited by examiner

COMPONENT SUPPLY DEVICE

TECHNICAL FIELD

The present disclosure relates to a component supply device comprising a stage on which components are scattered.

BACKGROUND ART

In a component supply device, as described in the following patent literature, clogging of components or the like may occur.

CITATION LIST

Patent Literature

Patent literature 1: JP-A-H02-305707

BRIEF SUMMARY

Technical Problem

An object of the present disclosure is to eliminate clogging and the like of components in a component supply device.

Solution to Problem

To solve the above problems, disclosed herein is a component supply device including: a stage configured such that components can be scattered on the stage; a slide device configured to slide the stage; a contacting section configured to contact the component scattered on the stage in accordance with sliding of the stage by the slide device; and a control device configured to control operation of the slide device, wherein the control device includes a determining section configured to determine whether the stage has been slid to a set position when the stage is slid towards the contacting section, and an operation control section configured to control operation of the slide device so as to, in a case in which it is determined by the determining section that the stage has not been slid to the set position, after sliding the stage in a direction away from the contacting section, once again slide the stage towards the contacting section.

Advantageous Effects

According to the present disclosure, when there is a high possibility that clogging or the like of components will occur, the clogging or the like of the components is solved by sliding the stage on which the components are scattered.

DESCRIPTION OF EMBODIMENTS

The following describes in detail referring to the figures an example embodiment of the present disclosure.

(A) Configuration of Component Mounter

Figure 1:
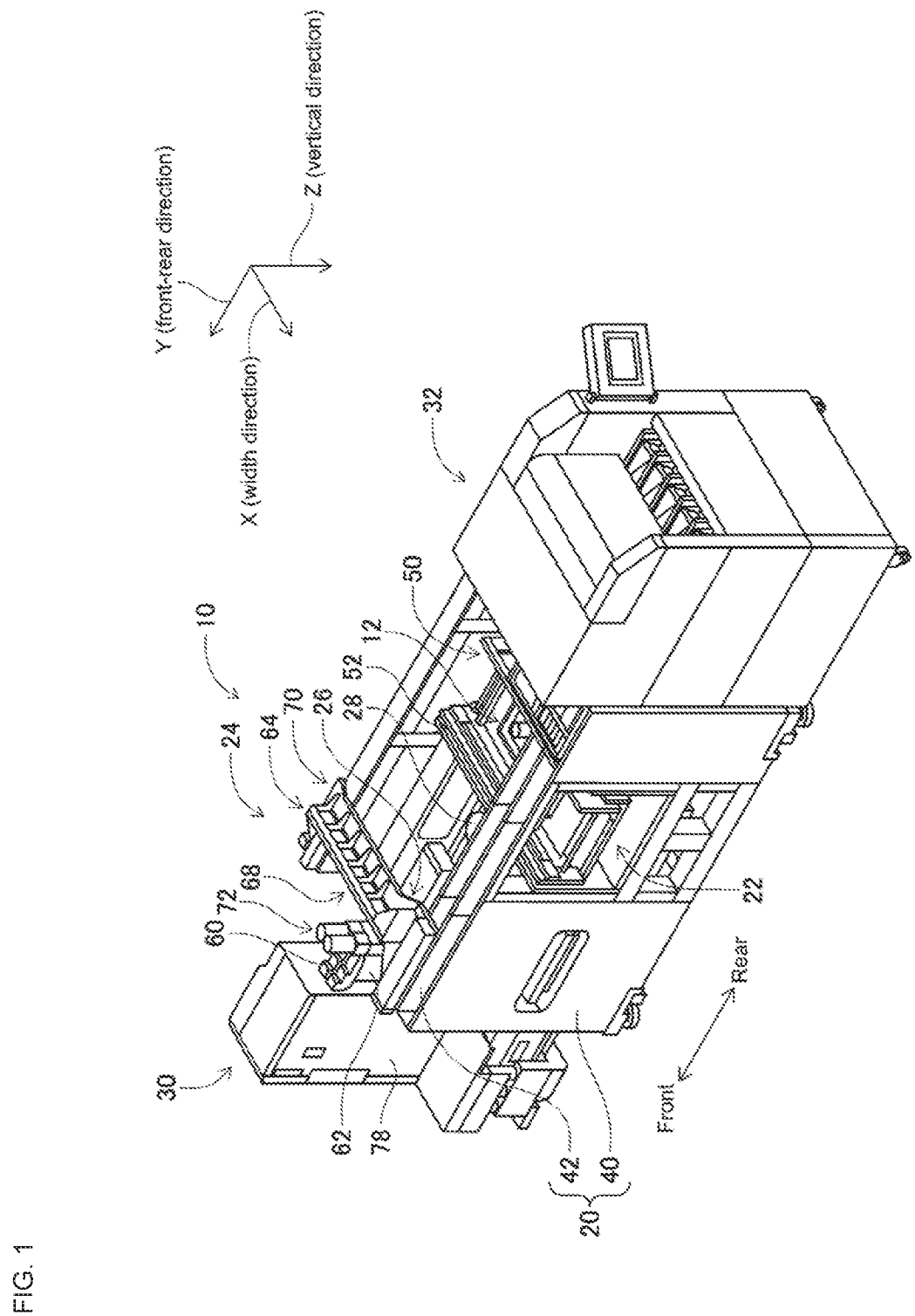
FIG. 1 is a perspective view of a component mounter.

FIG. 1 shows component mounter 10. Component mounter 10 performs work of mounting components on circuit board 12. Component mounter 10 is provided with device main body 20, board conveying and holding device 22, component mounting device 24, imaging devices 26 and 28, component supply device 30, loose component supply device 32, and control device 34 (refer to FIG. 11). Note that, examples of circuit board 12 include circuit boards and boards with a three-dimensional construction, examples of a circuit board being a printed wiring board or a printed circuit board.

Device main body 20 is configured from frame section 40 and beam section 42 that is mounted on frame section 40. Board conveying and holding device 22 is positioned centrally inside frame section 40 in the front-rear direction, and includes conveyance device 50 and clamp device 52. Conveyance device 50 conveys circuit board 12, and clamp device 52 holds circuit board 12. Thus, board conveying and holding device 22 conveys circuit board 12 and fixedly holds circuit board 12 at a specified position. Note that, in the descriptions below, the conveyance direction of circuit board 12 is referred to as the X direction, the direction horizontally perpendicular to the X direction is referred to as the Y direction, and the vertical direction is referred to as the Z direction. That is, the width direction of component mounter 10 is the X direction, and the front-rear direction is the Y direction.

Figure 2:
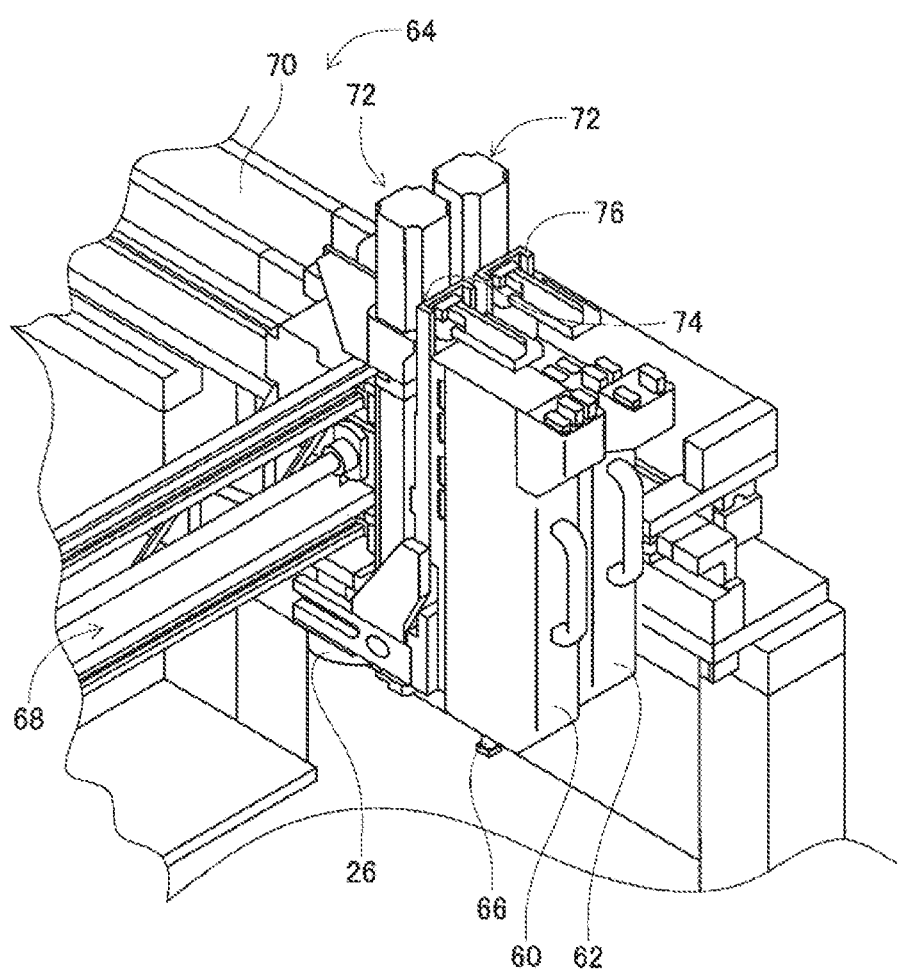
FIG. 2 is a perspective view of a component mounting device of the component mounter.

Component mounting device 24 is provided on beam section 42, and includes work heads 60 and 62 and work head moving device 64. Each work head 60 and 62 includes suction nozzle 66 (refer to FIG. 2) and holds a component using suction nozzle 66. Further, work head moving device 64 includes X-direction moving device 68, Y-direction moving device 70, and Z-direction moving device 72. Work heads 60 and 62 are moved together to any position on frame 40 by X-direction moving device 68 and Y-direction moving device 70. Also, as shown in FIG. 2, work head 60 and 62 are detachably attached to sliders 74 and 76 respectively, and Z-direction moving device 72 moves sliders 74 and 76 in a vertical direction individually. That is, work heads 60 and 62 are moved in a vertical direction individually by Z-direction moving device 72.

Imaging device 26 is attached to slider 74 in a state facing downwards, and is moved in the X direction, Y direction, and Z direction together with work head 60. Thus, imaging device 26 images any position on frame section 40. As shown in FIG. 1, imaging device 28 is provided in a state facing upwards on frame section 40 between board conveying and holding device 22 and component supply device 30. By this, imaging device 28 images a component held by suction nozzle 66 of work heads 60 and 62.

Component supply device 30 is provided at an end of frame section 40 in the front-rear direction. Component supply device 30 includes tray-type component supply device 78 and feeder-type component supply device (not shown). Tray-type component supply device 78 supplies components in a state arranged in a tray. The feeder-type component supply device supplies components via a tape feeder (not shown) or stick feeder (not shown).

Loose component supply device 32 is provided at the other end of frame section 40 in the front-rear direction. Loose component supply device 32 lines up multiple components that are in a scattered state, and supplies the components in a lined-up state. That is, this device arranges multiple components that have random orientations to have a specified orientation and supplies the components in the specified orientation. The configuration of component supply device 32 is described below in detail. Note that, components supplied by component supply device 30 and loose component supply device 32 may include electronic circuit components, configuration components of solar panels, configuration components of power modules, and the like. Also, electronic circuit components include components with leads and components without leads.

Figure 3:
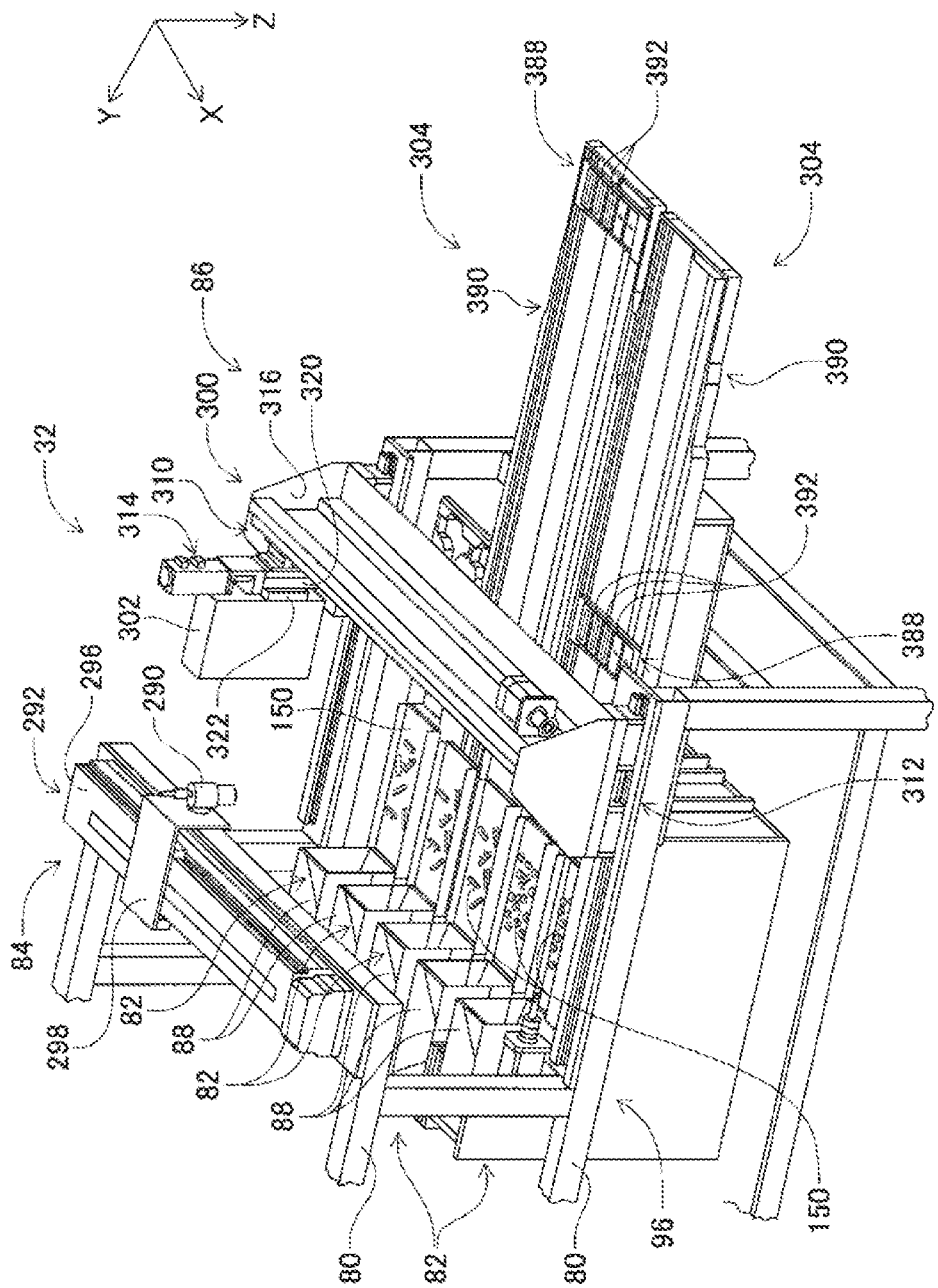
FIG. 3 is a perspective view of a loose component supply device.

As shown in FIG. 3, loose component supply device 32 includes main body 80, component supply unit 82, imaging device 84, and component transfer device 86.

(a) Component Supply Unit

Component supply unit 82 includes component supply apparatus 88, component scattering device 90 (refer to FIG. 4), and component returning device 92 (refer to FIG. 4), with component supply apparatus 88, component scattering device 90, and component returning device 92 being integrated into one unit. Component supply unit 82 is assembled to be removable from base 96 of main body 80, and with loose component supply device 32, five component supply units 82 are arranged in one row in the X direction.

(i) Component Supply Apparatus

Figure 4:
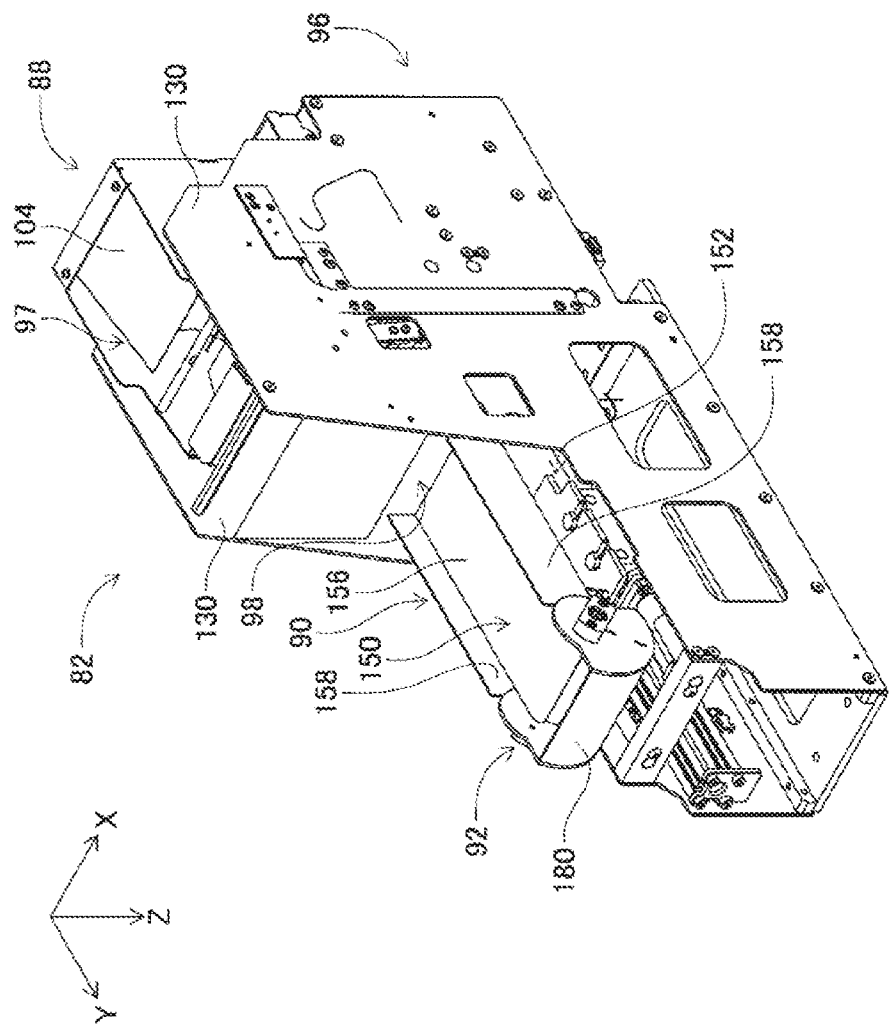
FIG. 4 is a perspective view of a component supply unit.
Figure 5:
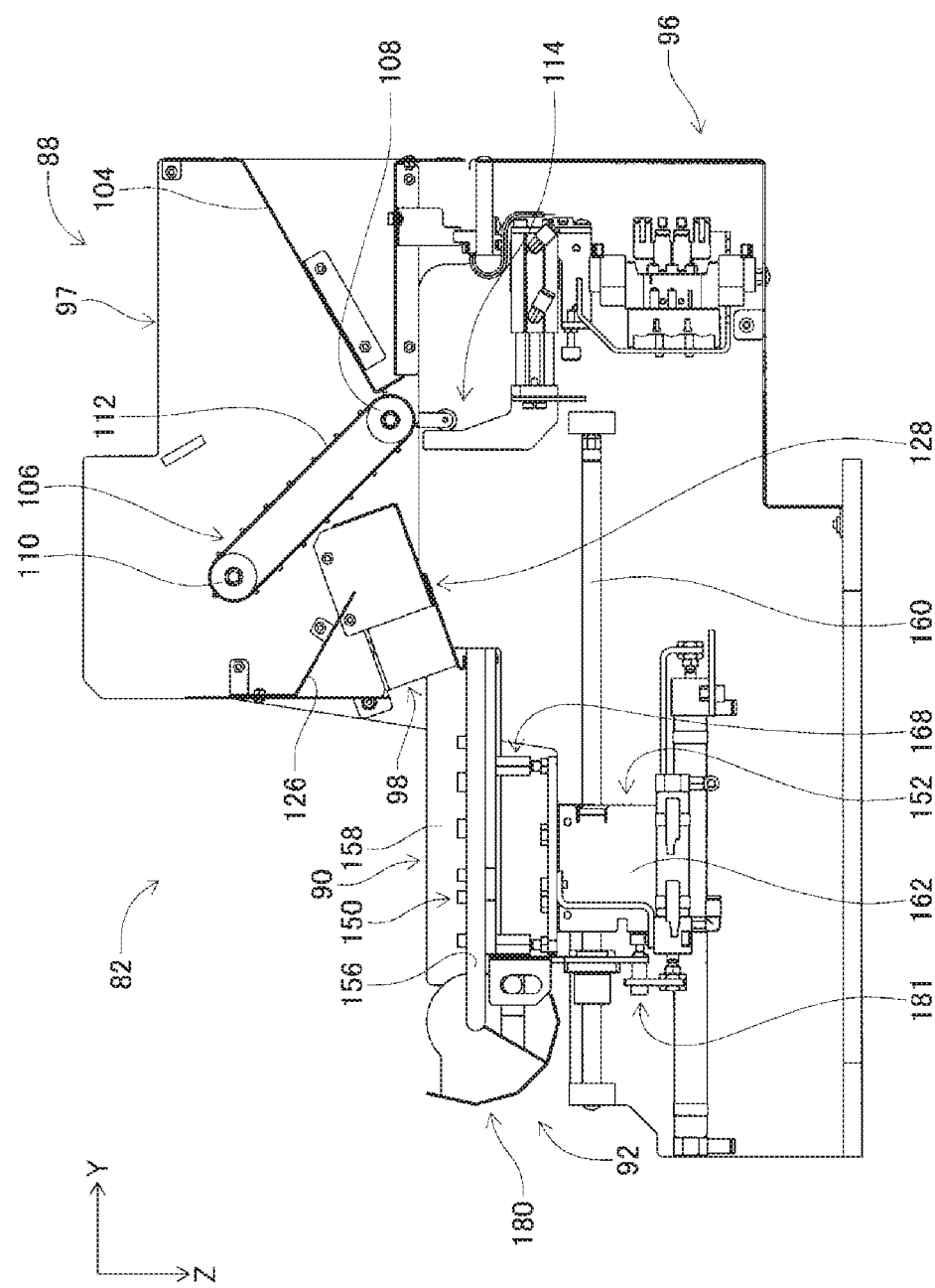
FIG. 5 is a transparent cross section view of the component supply unit.

As shown in FIGS. 4 and 5, component supply apparatus 88 is a substantially cuboid box arranged to extend in the Y direction. The Y direction is the front-rear direction of component supply apparatus 88, with the left side in FIG. 5 sometimes referred to as the front and the right side in FIG. 5 sometimes referred to as the rear. That is, in component supply unit 82, the side towards the end at which component returning device 92 is arranged is sometimes referred to as the front, and the side towards the end at which component supply apparatus 88 is arranged is sometimes referred to as the rear.

Component supply apparatus 88 has openings at the upper surface and front surface; the opening at the upper surface is component insertion opening 97 and the opening at the front surface is component discharge opening 98. With component supply apparatus 88, inclined plate 104 is provided below insertion opening 97. Inclined plate 104 is arranged across the entire width (X direction) of component supply apparatus 88 and is inclined from the rear end surface of component supply apparatus 88 towards the center such that the front end of inclined plate 104 is positioned lower than the rear end.

Also, as shown in FIG. 5, conveyor device 106 is arranged at the front side of inclined plate 104. Conveyor device 106 includes a pair of rollers 108 and 110, and conveyor belt 112. Each of the rollers 108 and 110 are arranged inside component supply apparatus 88 extending in the width direction of component supply apparatus 88 across the entire width of component supply apparatus 88. Roller 108 faces the front end of inclined plate 104, that is, the lowest end of inclined plate 104, with a clearance gap between them. Roller 110 is arranged diagonally above and to the front of roller 108. Conveyor belt 112 is stretched over the pair of rollers 108 and 110.

Also, the pair of rollers 108 and 110 are rotatable around their center axis, with rotation being controlled by operation of rotation device 114. The rotation direction of rollers 108 and 110 is the counterclockwise direction in FIG. 5. Thus, conveyor belt 112 revolves around rollers 108 and 110 in a counterclockwise direction in FIG. 5. In other words, the conveyance direction of conveyor belt 112 is diagonally up from the front end of inclined plate 104.

Also, inclined plate 126 is arranged diagonally below and in front of roller 110 of conveyor device 106. Inclined plate 126 is arranged across the entire width of component supply apparatus 88 and is inclined from the front end surface of component supply apparatus 88 to below roller 110 such that the rear end of inclined plate 126 is positioned lower than the front end. Further, inclined plate 128 is arranged below inclined plate 126. Inclined plate 128 is arranged across the entire width of component supply apparatus 88 and is inclined from below a central portion of conveyor device 106 towards discharge opening 98 of component supply apparatus 88 such that the front end of inclined plate 128 is positioned lower than the rear end.

As shown in FIG. 4, pair of side frame sections 130 are assembled on base 96. The pair of side frame sections 130 are parallel to each other and are arranged upright extending in the Y direction. The distance between the pair of side frame sections 130 is slightly larger than the width dimension of component supply apparatus 88, with component supply apparatus 88 being detachably mounted between the pair of side frame sections 130.

(ii) Component Scattering Device

Component scattering device 90 includes component support member 150 and component support member moving device 152. Component support member 150 is configured from stage 156 and pair of side walls 158. Stage 156 is a substantially rectangular plate and is arranged extending forwards from below component supply apparatus 88 mounted between pair of side frame sections 130. Note that, the upper surface of stage 156 is substantially horizontal and, as shown in FIG. 5, is arranged with a small clearance gap from the front end of inclined plate 128 of component supply apparatus 88. Also, as shown in FIG. 4, pair of side walls 158 is fixed upright at both ends of stage 156 in the lengthwise direction, with the upper end of each side wall 158 extending above the upper surface of stage 156.

Further, as shown in FIG. 5, component support section moving device 152 includes guide rail 160 and slider 162. Guide rail 160 extends in the lengthwise direction of stage 156 below component support member 150. Slider 162 is slidably attached to guide rail 160 so as to be slid to any position by operation of air cylinder 166 (refer to FIG. 11). Stage 156 of component support member 150 is connected to slider 162 via connection mechanism 168.

Thus, component support member 150 slides in the Y direction by operation of component support member moving device 152, so as to move to and from a stored state (refer to FIG. 6) stored below component supply apparatus 88 and an exposed state (refer to FIG. 5) drawn out from below component supply apparatus 88. When component support member 150 is slid to the stored state, slider 162 abuts against the rear end stopper (not shown) to restrict the component support member 150 from sliding rearward. On the other hand, when component support member 150 is slid to the exposed state, slider 162 contacts the front end stopper (not shown) to restrict component support member 150 from sliding forward.

(iii) Component Returning Device

Figure 7:
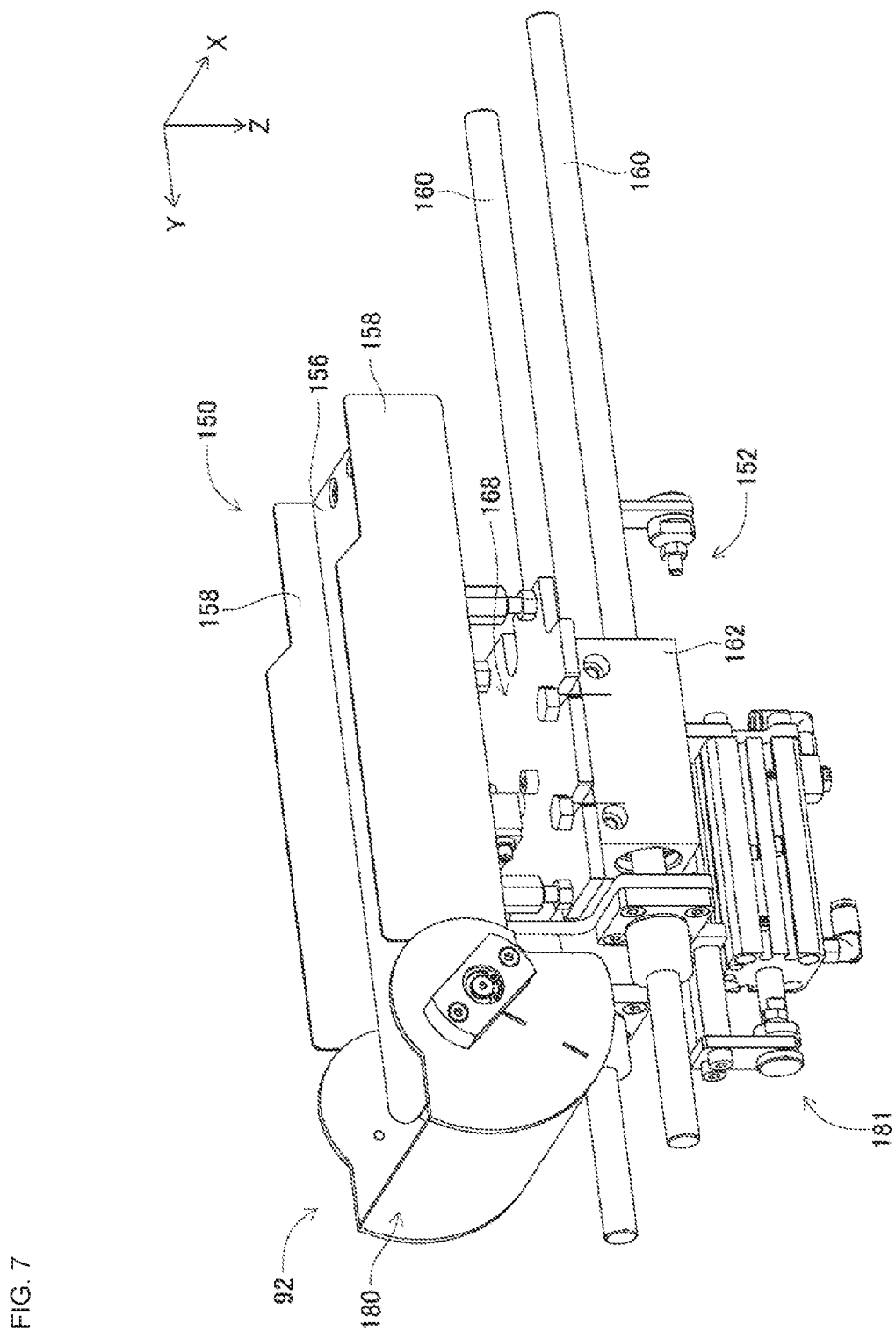
FIG. 7 is a perspective view of a component scattering device.
Figure 8:
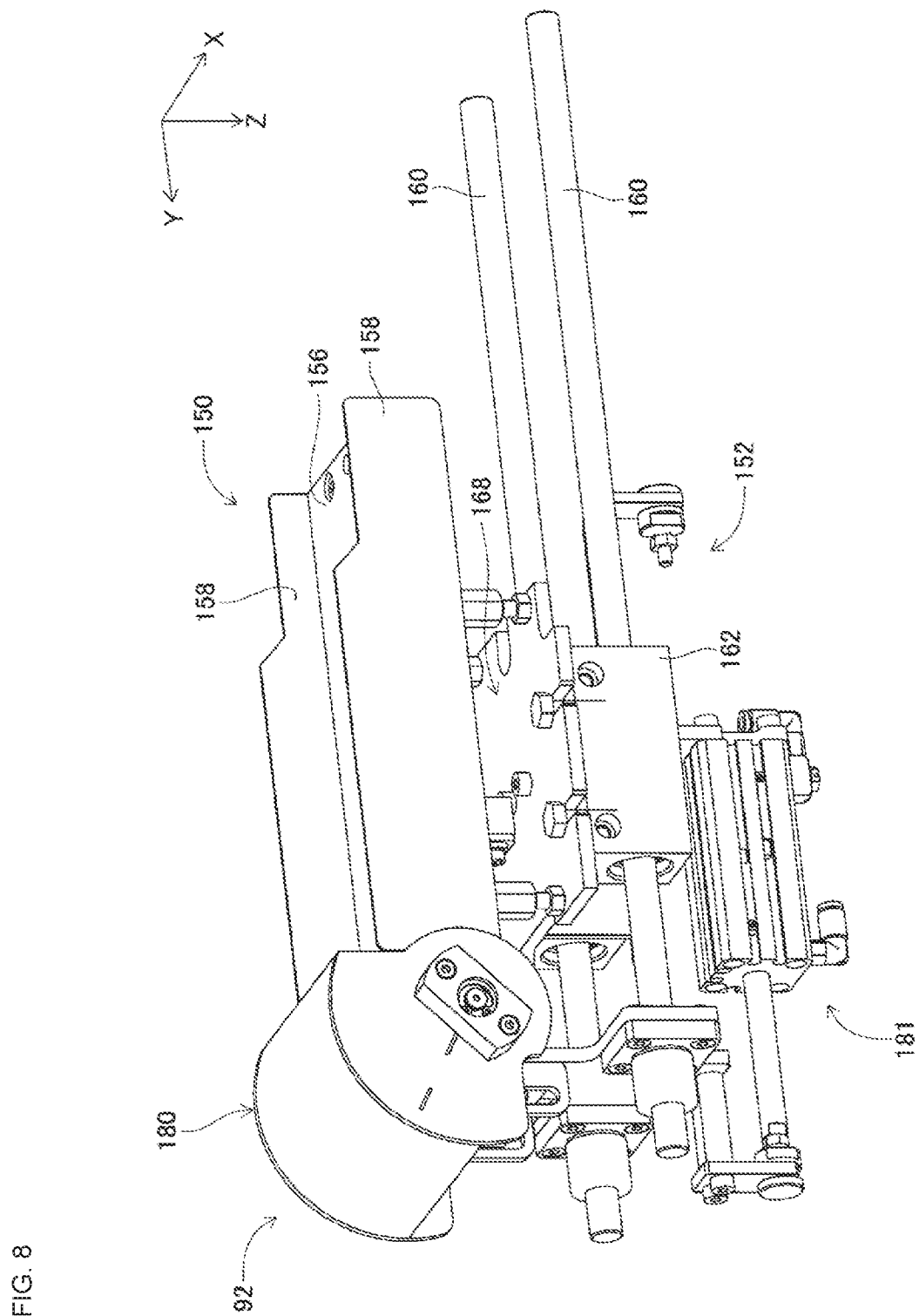
FIG. 8 is a perspective view of a component scattering device.

As shown in FIG. 7, component returning device 92 includes component storage container 180 and container oscillating device 181. Component storage container 180 is a box with an arc-shaped bottom surface. Component storage container 180 is held to be swingable around the front end of stage 156 of component support member 150 and is swung by operation of container oscillating device 181. Here, component storage container 180 is swung between a storing orientation (refer to FIG. 7) with the opening facing up, and a return orientation (refer to FIG. 8) with the opening facing the upper surface of stage 156 of component support member 150.

(b) Imaging Device

As shown in FIG. 3, imaging device 84 includes camera 290 and camera moving device 292. Camera moving device 292 includes guide rail 296 and slider 298. Guide rail 296 is fixed to main body 80 above component supply apparatus 88 so as to extend in the width direction (X direction) of loose component supply device 32. Slider 298 is slidably attached to guide rail 296, and can be slid to any position by operation of electromagnetic motor 299 (refer to FIG. 11). Also, camera 290 is attached to slider 298 facing downwards.

(c) Component Transfer Device

As shown in FIG. 3, component transfer device 86 includes component holding head moving device 300, component holding head 302, and two shuttle devices 304.

Component holding head moving device 300 includes X-direction moving device 310, Y-direction moving device 312, and Z-direction moving device 314. Y-direction moving device 312 includes Y slider 316 provided above component supply unit 82 and extending in the X direction, and Y slider 316 is moved to any position in the Y direction by operation of electromagnetic motor 319 (refer to FIG. 11). X-direction moving device 310 includes X slider 320 provided on a side surface of Y slider 316, and X slider 320 is moved to any position in the X direction by operation of electromagnetic motor 321 (refer to FIG. 11). Z-direction moving device 314 includes Z slider 322 provided on a side surface of X slider 320, and Z slider 322 is moved to any position in the Z direction by operation of electromagnetic motor 323 (refer to FIG. 11).

Figure 9:
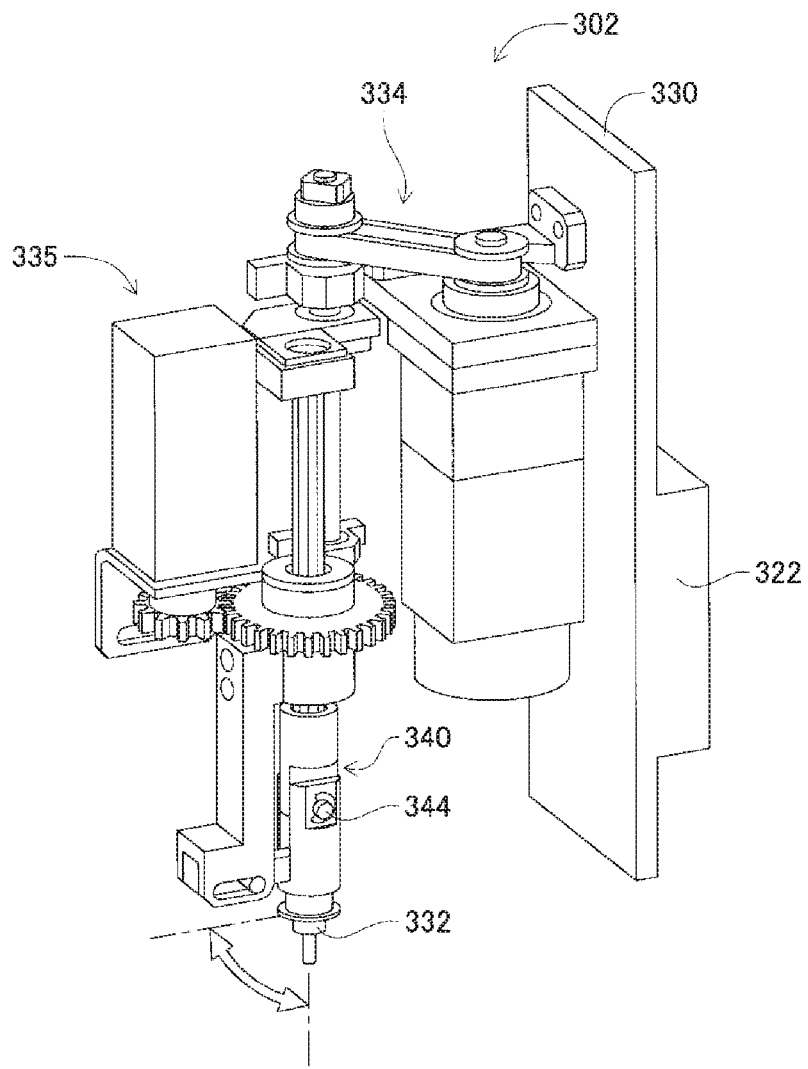
FIG. 9 is a perspective view of a component holding head.

As shown in FIG. 9, component holding head 302 includes head main body 330, suction nozzle 332, nozzle pivoting device 334, and nozzle rotating device 335. Head main body 330 is formed as one body with Z slider 322. Suction nozzle 332 is for holding a component, and is detachably attached to a lower end section of holder 340. Holder 340 is able to bend at support shaft 344, and holder 340 bends 90 degrees in an up direction by operation of nozzle pivoting device 334. By this, suction nozzle 332 attached to the bottom end of holder 340 is pivoted 90 degrees to be positioned at the pivoted position. That is, suction nozzle 332 is able to be pivoted to and from a non-pivoted position and a pivoted position by operation of nozzle pivoting device 334. Further, nozzle rotating device 335 rotates suction nozzle 332 around its own center axis.

Further, as shown in FIG. 3, each of the two shuttle devices 304 includes component carrier 388, and component carrier moving device 390, and is fixed to main body 80 lined up in the sideways direction on the front side of component supply unit 82. Five component receiving members 392 are attached to component carrier 388 lined up in a single row sideways, and components are loaded on each component receiving member 392.

Figure 10:
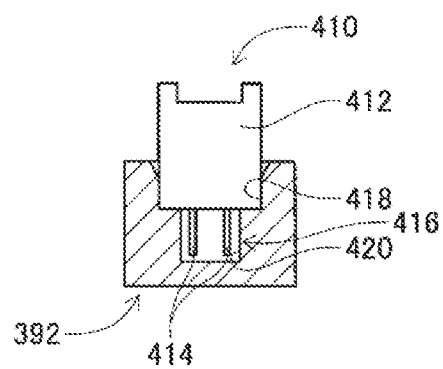
FIG. 10 shows a component receiving member in which is stored an electronic component.

Note that, loose component supply device 32 can be supplied with various components, and various forms of component receiving members 392 are prepared according to the shapes of the components. Here, regarding the electronic circuit component 410 supplied by loose component supply device 32, a component receiving member 392 corresponding to an electronic circuit component having leads as shown in FIG. 10 will be described. Electronic component 410 is composed of a block-shaped component main body 412 and two leads 414 projecting from the bottom surface of component main body 412. Component receiving member 392 is formed with component reception recess 416 shaped according to electronic component 410. Component reception recess 416 is a stepped recess configured from main body section reception recess 418 open at the top surface of component receiving member 392, and lead reception recess 420 open at the bottom surface of main body section reception recess 418. Further, electronic component 410 is inserted into the component reception recess 416 with leads 414 facing downward. Therefore, electronic component 410 is loaded inside component reception recess 416 with leads 414 inserted into lead reception recess 420 and component main body 412 inserted into main body section reception recess 418.

Also, as shown in FIG. 3, component carrier moving device 390 is a long plate member provided on the front side of component supply unit 82 and extending in the front-rear direction. Component carrier 388 is provided on the upper surface of component carrier moving device 390 to be slidable in the front-rear direction, and is slid to any position in the front-rear direction by operation of electromagnetic motor 430 (refer to FIG. 11). Note that, component carrier 388, when slid in a direction approaching component supply unit 82, is slid to a component receiving position that is positioned within the movement range of component holding head 302 by component holding head moving device 300. Conversely, when slid in a direction away from component supply unit 82, component carrier 388 is slid to a component supply position that is positioned within the movement range of work heads 60 and 62 by work head moving device 64.

Figure 11:
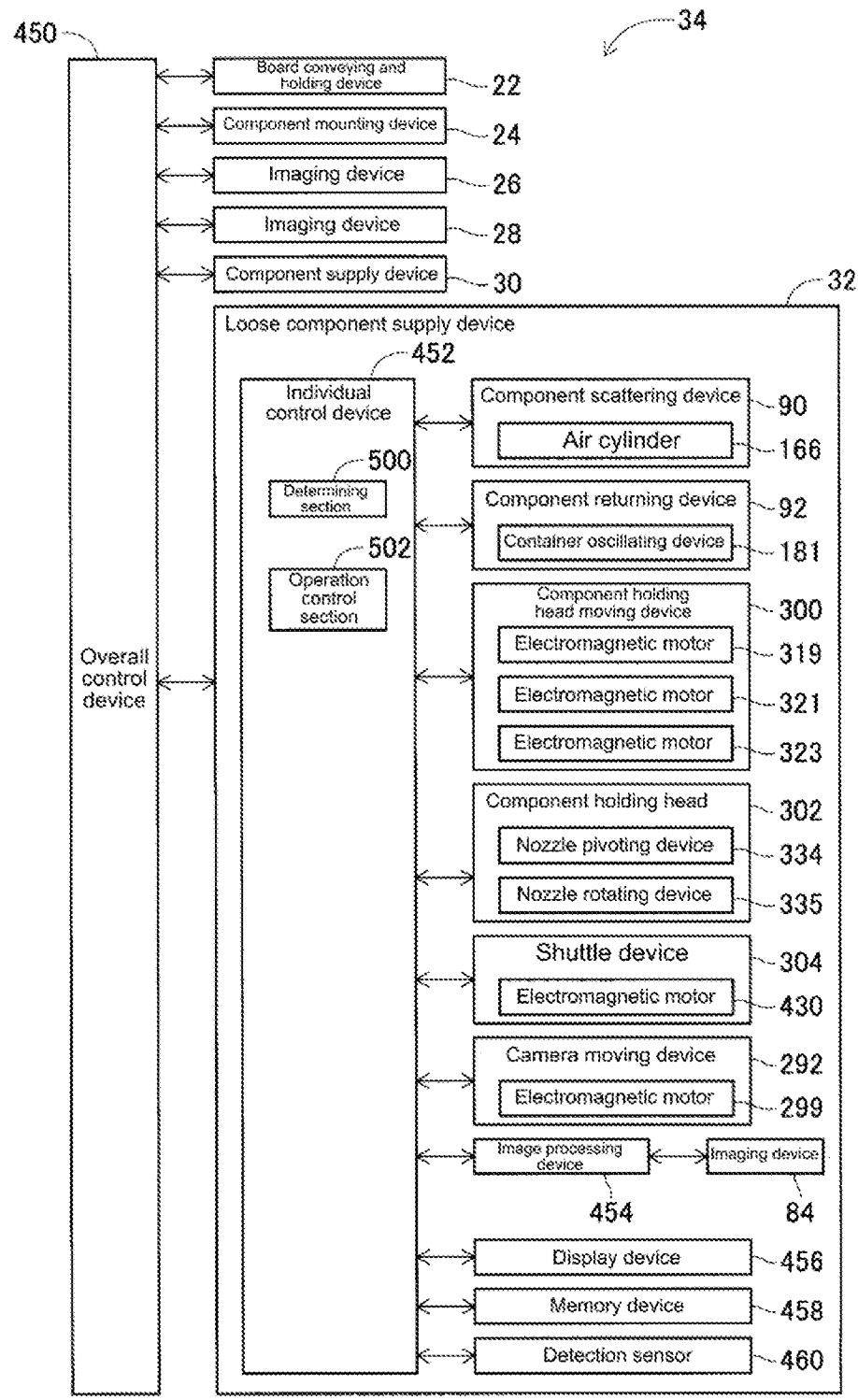
FIG. 11 is a block diagram showing a control device of the component mounter.

Further, as shown in FIG. 11, control device 34 includes overall control device 450, multiple individual control devices (only one is shown in the figure) 452, and image processing device 454. Overall control device 450 is configured mainly from a computer and is connected to board conveying and holding device 22, component mounting device 24, imaging device 26, imaging device 28, component supply device 30, and loose component supply device 32. Thus, overall control device 450 performs overall control of board conveying and holding device 22, component mounting device 24, imaging device 26, imaging device 28, component supply device 30, and loose component supply device 32. The multiple individual control devices 452 are configured mainly from a computer and are provided corresponding to board conveying and holding device 22, component mounting device 24, imaging device 26, imaging device 28, component supply device 30, and loose component supply device 32 (in the figure, only individual control device 452 corresponding to loose component supply device 32 is shown).

Individual control device 452 of loose component supply device 32 is connected to component scattering device 90, component returning device 92, camera moving device 292, component holding head moving device 300, component holding head 302, and shuttle device 304. Individual control device 452 of loose component supply device 32 controls component scattering device 90, component returning device 92, camera moving device 292, component holding head moving device 300, component holding head 302, and shuttle device 304. Also, image processing device 454 is connected to imaging device 84 and processes image data captured by imaging device 84. Image processing device 454 is connected to individual control device 452 of loose component supply device 32. By this, individual control device 452 of loose component supply device 32 acquires image data captured by imaging device 84.

Display device 456 is also connected to individual control device 452, and predetermined images are displayed on display device 456 in accordance with commands from individual control device 452. Memory device 458 is also connected to individual control device 452, and various kinds of data are stored in memory device 458. Further, detection sensor 460 is also connected to individual control device 452. Detection sensor 460 is a sensor that outputs a detection signal when component support member 150 moves to a state stored under the component supply apparatus 88, and the detection signal is inputted to individual control device 452.

(B) Component Mounter Operation

Component mounter 10, according to the above configuration, mounts components on circuit board 12 held by board conveying and holding device 22. Specifically, circuit board 12 is conveyed to a work position, and is fixedly held at that position by clamp device 52. Next, imaging device 26 moves above circuit board 12 and images circuit board 12. By this, information related to a holding position error of circuit board 12 is obtained. Also, component supply device 30 or loose component supply device 32 supplies components at a specified supply position. Component supply by loose component supply device 32 is described in detail later. One of the work heads 60 or 62 moves above the component supply position and holds a component using suction nozzle 66. Then, work head 60 or 62 holding the component moves above imaging device 28, and the component being held by suction nozzle 66 is imaged by imaging device 28. Accordingly, information related to an error of the holding position of the component is obtained. Next, work head 60 or 62 holding the component moves above circuit board 12, and mounts the held component on circuit board 12 after correcting for the error in the holding position of circuit board 12 and the error in the holding position of the component and so on.

(C) Loose Component Supply Device Operation (a) Supplying Electronic Components with Loose Component Supply Device With loose component supply device 32, electronic components 410 are inserted by an operator into insertion opening 97 of component supply apparatus 88, then, the inserted electronic components 410 are supplied in a state loaded on component receiving member 392 of component carrier 388 by operation of component supply unit 82 and component transfer device 86. In detail, the operator inserts electronic components 410 via the insertion opening 97 at the top of component supply apparatus 88. Here, component support member 150 is moved below component supply apparatus 88 by operation of component support member moving device 152 to be in a stored state (refer to FIG. 6). With component support member 150 in a stored state, component storage container 180 positioned at the front end of component support member 150 is positioned in front of component supply apparatus 88, and the opening of component storage container 180 is oriented facing up (storing orientation).

Figure 6:
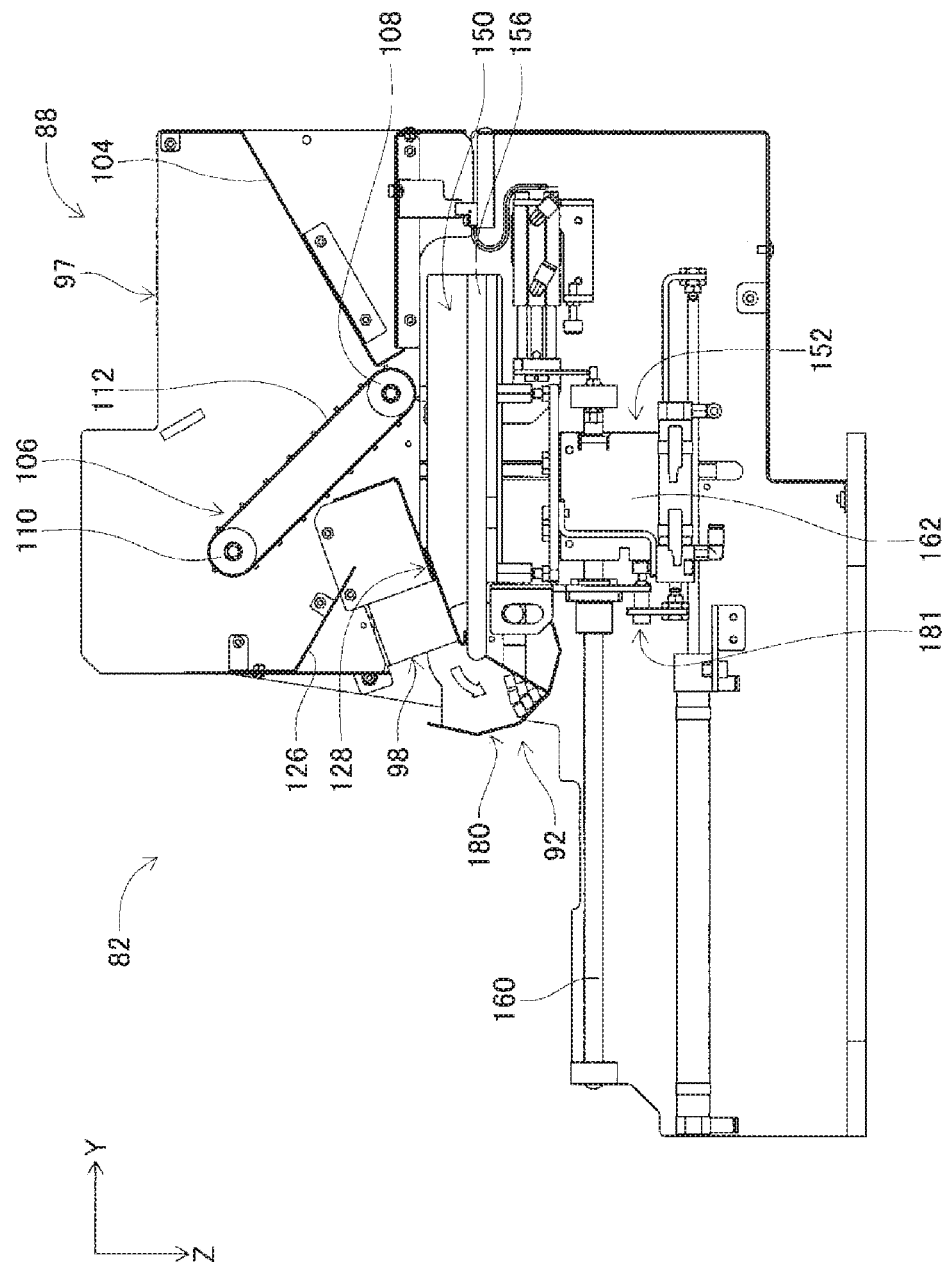
FIG. 6 is a transparent cross section view of the component supply unit.

Electronic components 410 inserted via insertion opening 97 on the top surface of component supply apparatus 88 fall onto inclined plate 104 of component supply apparatus 88 and roll down to the front lower end of inclined plate 104. Here, electronic components 410 that have rolled down to the front bottom end of inclined plate 104 pile up between the front bottom end of inclined plate 104 and the rear bottom end of conveyor device 106. Then, when rotation device 114 of conveyor device 106 is operated, conveyor belt 112 of conveyor device 106 is rotated counterclockwise as shown in FIG. 6. By this, electronic components 410 piled up between inclined plate 104 and conveyor belt 112 are conveyed by conveyor belt 112 diagonally up and forward.

Then, electronic components 410 conveyed upward diagonally by conveyor belt 112 drop from the upper front end of conveyor device 106 onto inclined plate 126. Electronic components 410 that have fallen onto inclined plate 126 roll towards the rear of inclined plate 126 onto inclined plate 128. Then, electronic components 410 that have fallen onto inclined plate 128 roll towards the front and are discharged from discharge opening 98 at the front of component supply apparatus 88.

Component support member 150 is moved towards the front from under component supply apparatus 88 due to operation of component support member moving device 152 at the time that electronic components 410 are discharged from discharge opening 98 of component supply apparatus 88. By this, electronic components 410 discharged from discharge opening 98 of component supply apparatus 88 are discharged onto the upper surface of stage 156 of component support member 150.

Note that, electronic components 410 that have been discharged onto stage 156 from component supply apparatus 88 roll forward, though even if they roll and fall from the front of stage 156 they are stored in component storage container 180. Also, if electronic components 410 that have been discharged onto stage 156 from component supply apparatus 88 roll sideways, they are prevented from falling from stage 156 by side walls 158 of component support member 150.

Then, component support member 150 is moved forwards from the stored state to the exposed state and then movement of component support member 150 is stopped. By this, electronic components 410 are scattered across the entire upper surface of stage 156. With component supply apparatus 88, operation of conveyor device 106 is stopped to match the timing of the stopping of the operation of component support member 150 such that discharge of electronic components 410 from component supply apparatus 88 is stopped.

According to the above procedure, when electronic components 410 are scattered from component supply apparatus 88 onto stage 156 of component support member 150, camera 290 of imaging device 84, by operation of camera moving device 292, moves above component support member 150 and images electronic components 410. Then, electronic components 410 scattered on the upper surface of component support member 150, based on the imaging data, are divided into electronic components that can be picked up by suction nozzle 332 (also referred to as "pickup target components") and electronic components that cannot be picked up by suction nozzle 332 (also referred to as "non-pickup target components").

As it is not particularly relevant to the present disclosure, the method for dividing into pickup target components and non-pickup target components will be described only briefly electronic components 410 with a surface, such as an uneven surface, that makes pickup difficult facing up, tilted electronic components 410, and the like are designated as non-pickup target components, and other electronic components 410 are designated as pickup target components. Based on the imaging data, information such as the position on component support member 150 and the orientation of electronic components 410 is obtained with regard to the electronic components 410 designated as pickup target components.

Then, based on the obtained position information of the pickup target components, component holding head 302 is moved above a pickup target component by operation of component holding head moving device 300 and the pickup target component is picked up using suction nozzle 332. Note that, when the pickup target component is picked up and held by suction nozzle 332, suction nozzle 332 is in the non-pivoted position.

Then, after holding electronic component 410 using suction nozzle 332, component holding head 302 is moved above component carrier 388. Then, component carrier 388 is moved to the component receiving position by operation of component carrier moving device 390. Also, when component holding head 302 is moved above component carrier 388, suction nozzle 332 is pivoted to the pivoted position. Note that, suction nozzle 332 is rotated by operation of nozzle rotating device 335 such that leads 414 of the electronic component 410 held by suction nozzle 332 that is in the pivoted position face downwards in a vertical direction.

When component holding head 302 is moved above component carrier 388, electronic component 410 in a state with leads 414 facing downwards in the vertical direction is inserted into component reception recess 416 of component reception member 392. By this, as shown in FIG. 10, electronic component 410 is loaded in component receiving member 392 with leads 414 facing vertically downwards.

Also, when electronic component 410 is loaded on component receiving member 392, component carrier 388 is moved to the component supply position by operation of component carrier moving device 390. With loose component supply device 32, because component carrier 388 moved to the component supply position is within the movement range of work heads 60 and 62, electronic components 410 are supplied at this position. In this manner, with loose component supply device 32, electronic components 410 are supplied with leads 414 pointing downwards, and with the upper surface that is opposite to the bottom surface to which leads 414 are connected facing upwards. Therefore, suction nozzle 66 of work head 60 or 62 is able to appropriately hold electronic component 410.

(b) Storage of Electronic Components in Component Storage Container and Scattering on Stage With loose component supply device 32, when pickup target components are scattered on stage 156 of component support member 150, pickup of the scattered pickup target components is repeated and the picked up pickup target components are loaded on component receiving member 392. Then, by component carrier 388 mounted on component receiving member 392 being moved to the component supply position, supply of electronic components 410 is performed. However, if components to be picked up are not scattered on stage 156 of component support member 150, the electronic components 410 cannot be picked up from stage 156. That is, if all of the pickable electronic components 410 are picked up and only the non-pick-up target components remain on stage 156, electronic components 410 cannot be picked up from stage 156.

Thus, with loose component supply device 32, in such a case, electronic components 410 remaining on stage 156 are collected in component storage container 180. Then, the electronic components 410 collected in component storage container 180 are scattered over stage 156 again, and the orientation of the electronic components 410 is changed, whereby picking up of the electronic components 410 from stage 156 is resumed. However, if the quantity of electronic components 410 collected in component storage container 180 is small, it is possible that the quantity of pickup target components on stage 156 will be too small even though electronic components collected in component storage container 180 have been re-scattered onto stage 156.

Therefore, in such a case, it is desirable that not only are electronic components 410 collected in component storage container 180 re-scattered over stage 156, but that electronic components 410 are replenished from component supply apparatus 88. That is, it is desirable that electronic components 410 from both component storage container 180 and component supply apparatus 88 be replenished onto stage 156. In view of this, when the quantity of electronic components 410 remaining on stage 156 is less than or equal to a set quantity, the electronic components 410 are replenished on stage 156 from both component storage container 180 and component supply apparatus 88. On the other hand, when the quantity of electronic components 410 remaining on stage 156 exceeds the set number, electronic components 410 are replenished on stage 156 only from component storage container 180.

Specifically, when all of the pickup target components on stage 156 have been picked up, stage 156 is imaged by camera 290 of imaging device 84, and the quantity of electronic components 410 remaining on stage 156 is calculated based on the image data. Then, if the quantity of electronic components 410 is equal to or less than the set quantity, electronic components 410 are replenished on stage 156 from both component storage container 180 and component supply apparatus 88.

In detail, first, component support member 150 is moved below component supply apparatus 88 by operation of component support member moving device 152. That is, component support member 150 is moved from the exposed state (refer to FIG. 5) towards the stored state (refer to FIG. 6). Here, the front end of component support member 150, that is, component storage container 180 provided at the rear end of component support member that moves, is oriented such that the opening is facing up (collection orientation). Then, when component support member 150 is moved from the exposed state towards the stored state, electronic components 410 are discharged onto stage 156 of component support member 150 from component supply apparatus 88. Note that, because the discharge of electronic components 410 from component supply apparatus 88 is performed in the same manner to the procedure described above, descriptions are omitted here.

When electronic components 410 are discharged from component supply apparatus 88 onto stage 156, on stage 156 there are electronic components 410 discharged from component supply apparatus 88 and electronic components 410 that remained on stage 156 from before discharge. Note that, also when electronic components 410 are discharged from component supply apparatus 88, component support member 150 moves towards the stored state. Therefore, electronic components 410 on stage 156 of component support member 150 are stopped by the front end of inclined plate 128 of component supply apparatus 88 in accordance with the movement of component support member 150.

Further, as shown in FIG. 6, when component support member 150 reaches the stored state, electronic components 410 on stage 156 fall inside component storage container 180. By this, electronic components 410 remaining on stage 156 are collected in component storage container 180. In other words, electronic components 410 discharged from component supply apparatus 88 when component support member 150 was moving towards the stored state and electronic components 410 remaining on stage 156 from before the electronic components 410 were discharged from component supply apparatus 88 are collected in component storage container 180.

According to the above procedure, when electronic components 410 are collected in component storage container 180, those electronic components 410 are replenished onto stage 156. In detail, when collection of electronic components 410 into component storage container 180 is complete, as shown in FIG. 6, component support member 150 is in the stored state. Therefore, component support member 150 is moved from the stored state towards the front by the operation of component support member moving device 152. Note that, when component support member 150 is moved forwards from the stored state, conveyor device 106 of component supply apparatus is not operated. That is, electronic components 410 are not discharged onto stage 156 from component supply apparatus 88.

Also, when component support member 150 has been moved forward from the stored state by a specified amount, container swinging device 181 of component returning device 92 is operated and component storage container 180 is swung. Accordingly, the orientation of component storage container 180 is changed suddenly from an orientation with the opening of facing up (storing orientation) to an orientation with the opening facing stage 156 (returning orientation). In this case, electronic components 410 collected in component collection container 180 are discharged with strong force towards stage 156. Thus, by scattering electronic components 410 on stage 156 from component storage container 180, the orientation of the electronic components 410 is changed, and electronic components 410 are picked up again from stage 156. Note that, after electronic components 410 have been scattered on stage 156 from component storage container 180, the orientation of component storage container 180 returns from the orientation with the opening facing stage 156 (returning orientation) to the orientation with the opening facing up (collection orientation).

Also, after all of the pickup target components on stage 156 have been picked up, if the quantity of electronic components 410 remaining on stage 156 exceeds a set number, electronic components 410 are replenished on stage 156 only from component storage container 180. Here, in the same manner as when electronic components 410 are replenished from both component storage container 180 and component supply apparatus 88, first, component support member 150 is moved from the exposed state towards the stored state. However, electronic components 410 are not replenished from component supply apparatus 88.

Electronic components 410 on stage 156 are stopped by the front end of inclined plate 122 of component supply apparatus 88 in accordance with the movement of component support member 150. Further, when component support member 150 reaches the stored state, electronic components 410 on stage 156 fall inside component storage container 180. By this, electronic components 410 remaining on stage 156 are collected in component storage container 180. Here, for component collection container 180, only electronic components 410 remaining on stage 156 after pickup from stage 156 are collected in component storage container 180. When component support member 150 reaches the stored state, component support member 150 is moved again towards the exposed state. In this case, component storage container 180 is swung based on the above procedure. By this, electronic components 410 collected in component storage container 180 are replenished onto stage 156.

(c) Eliminating Clogging of Component During Component Collection

In the above manner, with loose component supply device 32, electronic components 410 on stage 156 are collected in component storage container 180, and the electronic components 410 collected in component storage container 180 are scattered on stage 156. This enables the changing of the orientation of the electronic components on stage 156 such that electronic components 410 can once again be picked up from stage 156.

Figure 12:
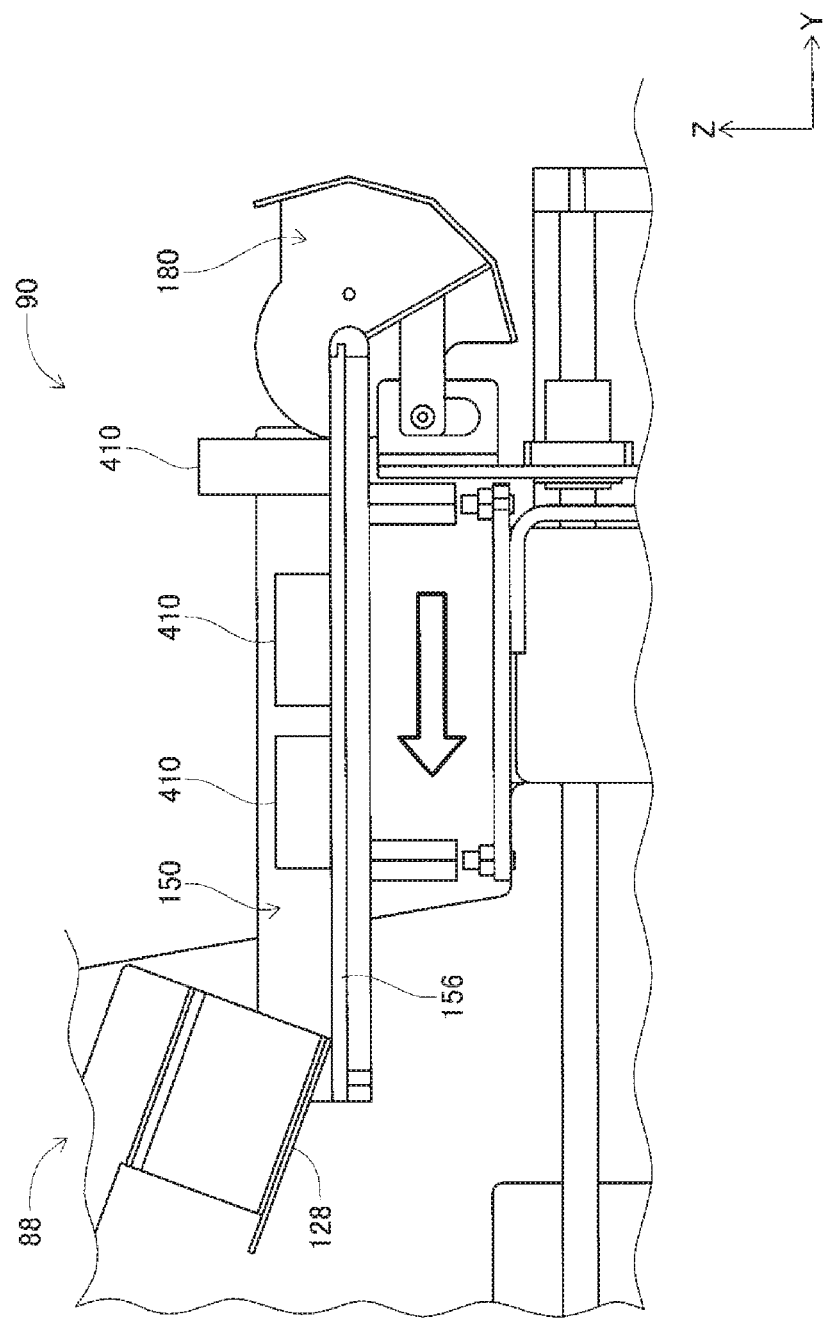
FIG. 12 is a side view of the component supply unit with electronic components scattered on the stage.

However, when electronic components 410 on stage 156 are collected into component storage container 180, clogging of the electronic components 410 may occur and the electronic components 410 may not be appropriately collected into the component storage container 180. Specifically, component support member 150 slides from the exposed state to the stored state to collect the electronic components 410 on stage 156 into component storage container 180. Here, as shown in FIG. 12, there are cases in which multiple electronic components 410 on stage 156 are arranged in a straight line in the sliding direction of component support member 150, that is, the Y direction.

Figure 13:
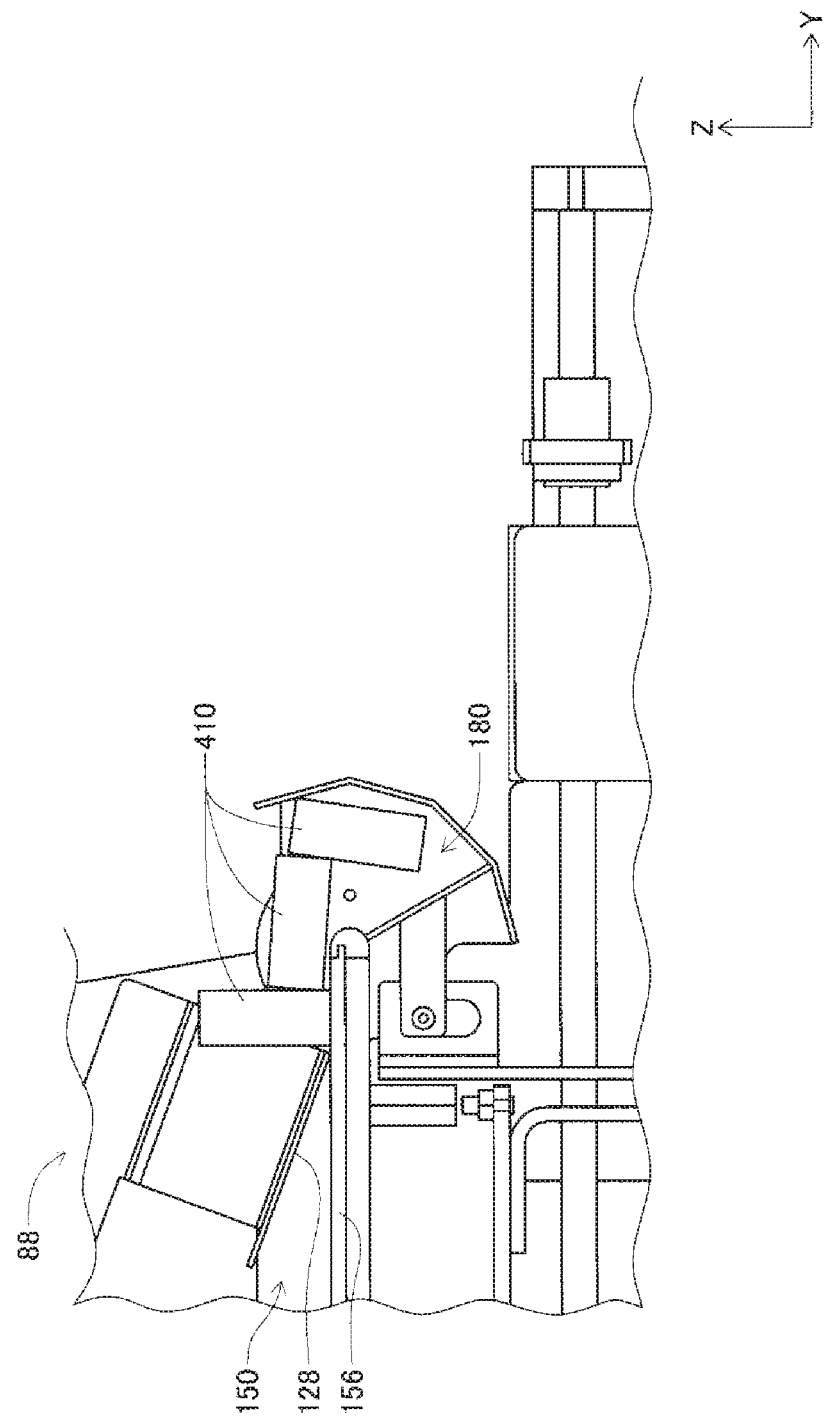
FIG. 13 is a side view of the component supply unit in a state in which clogging of electronic components has occurred.

In such cases, when component support member 150 slides toward the stored state, the multiple electronic components 410 may become clogged between the front end of inclined plate 128 of component supply apparatus 88 and inner wall surface of component storage container 180, as shown in FIG. 13. Thus, when an electronic component 410 on stage 156 becomes clogged as component support member 150 is sliding toward the stored state, the component support member 150 cannot move to the stored state and the electronic component 410 cannot be appropriately collected into component storage container 180. Therefore, with loose component supply device 32, when an electronic component 410 is clogged, the clogging of the electronic component 410 is cleared by the sliding of component support member 150 and the swinging of component storage container 180.

Specifically, when component support member 150 begins to slide from the exposed state toward the stored state to collect electronic components 410 on stage 156 into component storage container 180, the elapsed time since the initiation of the sliding of component support member 150 is measured by individual control device 452 of loose component supply device 32. Then, if component support member 150 has not moved to the exposed state by the time the measured elapsed time exceeds the set time, it is determined that an electronic component 410 has become clogged during the sliding of component support member 150. In other words, if individual control device 452 does not receive a detection signal from detection sensor 460 by the time the measured elapsed time exceeds the set time, it is determined that clogging of electronic components 410 has occurred during the sliding of component support member 150.

Figure 14:
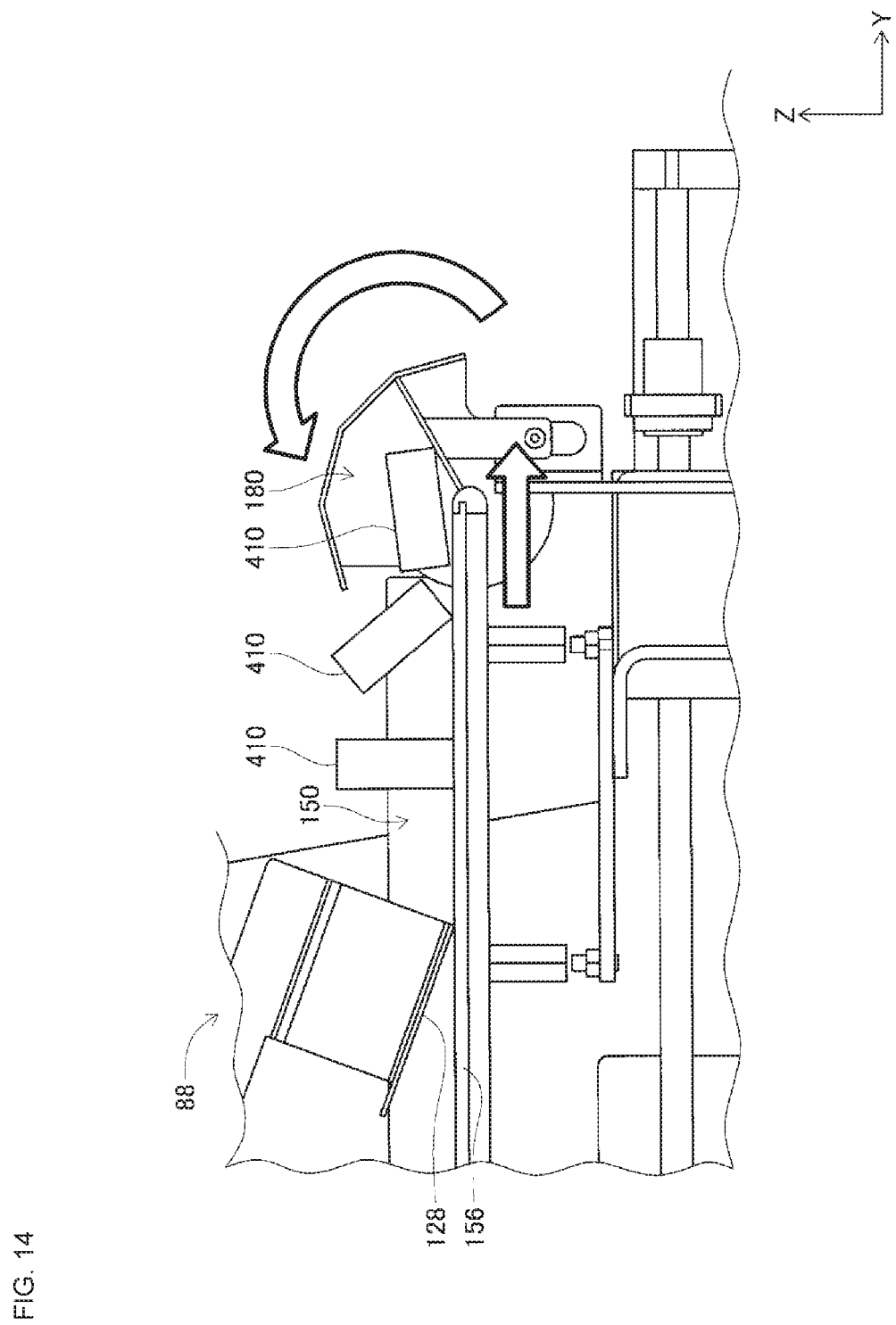
FIG. 14 illustrates operation of the component supply unit for resolving the clogging of the electronic circuit components.

Then, upon determining that clogging of electronic components 410 has occurred during the sliding of component support member 150, individual control device 452 controls operation of component support member moving device to slide component support member 150 to the exposed state. Further, when component support member 150 is sliding towards the exposed state, individual control device 452 controls operation of container oscillating device 181 so that the orientation of component storage container 180 changes from a collection orientation to a returning orientation. As a result, the multiple electronic components 410 sandwiched between the front end portion of inclined plate 128 of component supply apparatus 88 and the inner wall surface of component storage container 180 are released as shown in FIG. 14, and the clogging of electronic components 410 is eliminated.

Then, when component support member 150 reaches the exposed state, component support member 150 is moved toward the stored state again. Before component support member 150 is moved towards the stored state, the orientation of component storage container 180 is returned from the returning orientation to the collection orientation. Thus, electronic components 410 the clogging of which was eliminated are appropriately collected in component storage container 180.

Note that, there are cases in which clogging of electronic components 410 will not be eliminated even if component support member 150 is slid to the exposed state and component storage container 180 oscillated to the returning orientation when clogging of electronic components 410 occurs. In such a case, after sliding component support member 150 and oscillating component storage container 180, even when component support member 150 is moved towards the stored state, component support member 150 does not reach the stored state. In other words, during movement of component support member 150 to the stored state, it is determined that clogging of electronic components 410 occurred. Therefore, in such cases, the sliding of component support member 150 to the exposed state and the oscillating of component storage container 180 to the returning orientation are performed again. Note that, if the clogging of electronic components 410 is not eliminated even after repeating operation three times of sliding component support member 150 to the exposed state and oscillating component storage container 180 to the returning orientation, an error screen is displayed on display device 456.

Further, if clogging of electronic components 410 occurs and sliding of component support member 150 to the exposed state and oscillating of component storage container 180 to the returning orientation is performed, the control history at that time is memorized in memory device 458. As the control history, the date and time when the operation for eliminating the clogging of electronic components 410, that is, the sliding of component support member 150 to the exposed state and the oscillating of component storage container 180 to the returning orientation were performed are memorized in memory device 458. Memory device 458 also memorizes information related to the electronic component 410 for which the clogging occurred, as well as the date and time of operation for eliminating the clogging of the electronic components 410.

Control histories from when clogging of electronic components 410 occurred accumulate, and when the quantity of memorized control histories exceeds a set quantity, a screen prompting maintenance is displayed on display device 456. If a set quantity of clogging of electronic components 410 occurs, this indicates that trouble is occurring at component storage container 180 or the like. Thus, by display device 456 displaying a screen prompting maintenance, an operator performs maintenance of component storage container 180 or the like, and clogging of electronic components 410 is curtailed.

Also, by memorizing information related to the electronic component 410 for which clogging occurred as control history, it is possible to identify which types of electronic components 410 become clogged easily and which do not become clogged easily. In other words, it is possible to identify the occurrence rate of clogging by the type of electronic component 410. Thus, the set quantity used when scattering electronic components 410 collected in component storage container 180 from stage 156 onto stage 156 again is changed in accordance with the clogging rate of the electronic component 410.

In detail, when electronic components 410 on stage 156 are collected into component storage container 180, component clogging is more likely to occur if many components remain on stage 156. For this reason, when an electronic component 410 having a higher clogging rate is to be supplied, it is not desirable that many components remain on stage 156 at the time of collection to component storage container 180. On the other hand, when an electronic component 410 having a lower clogging rate is to be supplied, it is acceptable for a relatively large quantity of components to remain on stage 156 at the time of collection to component storage container 180.

Also, as described above, before electronic components 410 on stage 156 are collected into component storage container 180, stage 156 is imaged by camera 290 and the quantity of electronic components 410 remaining on stage 156 is calculated based on the image data. Then, if the calculated quantity of electronic components 410 exceeds a set quantity, electronic components 410 are replenished onto stage 156 from component storage container 180 only. On the other hand, if the calculated quantity of electronic components 410 is equal to or less than the set quantity, electronic components 410 are replenished onto stage 156 from both component storage container 180 and component supply apparatus 88.

That is, when the calculated quantity of electronic components 410 exceeds the set quantity, the electronic components 410 on stage 156 are collected in component storage container 180 in a state with a relatively small quantity of electronic components 410 scattered on stage 156. On the other hand, when the calculated quantity of electronic components 410 is equal to or less than the set quantity, the electronic components 410 on stage 156 are collected in component storage container 180 in a state with a relatively large quantity of electronic components 410 scattered on stage 156.

Therefore, in view of the above, the higher the clogging rate, the lower the set quantity is set. Thus, it is made less likely that the calculated quantity of electronic components 410 will be equal to or less than the set quantity for electronic components with a high clogging rate, while collection work of components to component storage container 180 in a state with a relatively large quantity of electronic components 410 scattered on state 156 is made less frequent. This makes it possible to curtail the occurrence of clogging of components.

Further, as shown in FIG. 11, individual control device 452 includes determining section 500 and operation control section 502. Determining section 500 is a functional section for, when component support member 150 is being moved towards the stored state, determining whether component support member 150 is at the set position, that is, whether component support member 150 has moved to a position based on the stored state. Operation control section 502 is a functional section for, in a case in which component support member 150 has not been moved to the stored state, sliding component supply member 150 to the exposed state and oscillating component storage container 180 to the returning orientation.

Note that, loose component supply device 32 is an example of a component supply device. Inclined plate 128 is an example of a contacting section. Stage 156 is an example of a stage. Component support member moving device 152 is an example of a slide device. Component storage container 180 is an example of a collection container. Container oscillating device 181 is an example of a container orientation changing device. Individual control device 452 is an example of a control device. Memory device 458 is an example of a memory section. Determining section 500 is an example of a determining section. Operation control section 502 is an example of an operation control section.

Further, the present disclosure is not limited to the above example embodiments, and various changed or improved methods of embodiment are possible based on the knowledge of someone skilled in the art. Specifically, for example, in an embodiment above, when an electronic component 410 is clogged, the sliding of component support member 150 to the exposed state and the swinging of component storage container 180 to the returning orientation are performed, but only the sliding of component support member 150 to the exposed state may be performed. When component support member 150 has been slid to the exposed state, by slider 162 contacting a stopper, vibration occurs in component support member 150, and due to that vibration, the clogging of electronic components is eliminated. Therefore, when clogging of electronic components 410 occurs, even if only the sliding of component support member 150 to the exposed state is performed, the clogging of the electronic components 410 can be appropriately eliminated.

Further, with an embodiment above, it is determined whether component support member 150 has moved to the exposed state based a detection signal of detection sensor 460, but it may be determined whether component support member 150 has moved to the exposed state by another method. For example, stage 156 may be imaged by camera 290, and based on the image data, it may be determined whether component support member 150 has moved to the exposed state.

Further, in an embodiment above, electronic component 410 is sandwiched between the front end portion of inclined plate 128 and the inner wall surface of component storage container 180, such that the component is clogged, but an electronic component 410 may become clogged at another portion. In this manner, it is possible to eliminate clogging of components even if the clogging of electronic components 410 occurs at another portion.

Also, in an embodiment above, the present disclosure is applied to electronic components 410 such as components with leads, but the present disclosure may be applied to various types of components. Specifically, for example, the present disclosure may be applied to configuration components of solar panels, configuration components of power modules, electronic components without leads, and so on.

REFERENCE SIGNS LIST

32: loose component supply device (component supply device);
128: inclined plate (contacting section);
156: stage;
152: component support member moving device (slide device);
180: component storage container (collection container);
181: container oscillating device (container orientation changing device)
452: individual control device (control device);
458: memory device (memory section);
500: determining section
502: operation control section

The invention claimed is:

1. A component supply device comprising:
a stage configured such that components can be scattered on the stage when the stage is an exposed state;
a slide device connected to the stage and configured to slide the stage between the exposed state and a storage state;
a contacting section configured to contact the components scattered on the stage in accordance with sliding of the stage by the slide device towards the storage state; and
a control device configured to control operation of the slide device, the control device includes
a determining section configured to determine whether the stage has been slid to a set position when the stage is slid towards the contacting section, and
an operation control section configured to control operation of the slide device so as to, in a case in which the determining section determines that the stage has not been slid to the set position, after sliding the stage in a direction away from the contacting section, once again slide the stage towards the contacting section.

2. The component supply device according to claim 1, further comprising:
a collection container provided at an end of the stage in a direction away from the contacting section with the stage slid towards the storage state and configured to collect the components that have been contacted by the contacting section when the stage has been slid towards the contacting section via an opening in the collection container.

3. The component supply device according to claim 2, further comprising:
a container orientation changing device configured to scatter the components that have been collected in the collection container onto the stage by changing the orientation of the collection container such that the opening of the collection container faces the stage, wherein
the control device is configured to control operation of the container orientation changing device s well as of the slide device, and
the operation control section is configured to control operation of the slide device and the container orientation changing device so as to, while sliding the stage gradually in a direction away from the contacting section, and after changing the orientation of the collection container such that the opening of the collection container faces the stage, once again slide the stage towards the contacting section.

4. The component supply device according to claim 1, further comprising:

a memory section configured to memorize a control history of the operation control section.

* * * * *